(12) United States Patent
Chen et al.

(10) Patent No.: US 11,695,430 B1
(45) Date of Patent: Jul. 4, 2023

(54) METHOD FOR DECODING POLAR CODES AND APPARATUS THEREOF

(71) Applicant: HON LIN TECHNOLOGY CO., LTD., Taipei (TW)

(72) Inventors: Tai-Hsun Chen, New Taipei (TW); Shin-Lin Shieh, New Taipei (TW)

(73) Assignee: HON LIN TECHNOLOGY CO., LTD., Taipei (TW)

( * ) Notice: Subject to any disclaimer, the term of this patent is extended or adjusted under 35 U.S.C. 154(b) by 0 days.

(21) Appl. No.: 17/836,143

(22) Filed: Jun. 9, 2022

(51) Int. Cl.
*H03M 13/00* (2006.01)
*H03M 13/13* (2006.01)
*H04B 17/309* (2015.01)
*H03M 13/45* (2006.01)

(52) U.S. Cl.
CPC ......... *H03M 13/13* (2013.01); *H03M 13/455* (2013.01); *H03M 13/612* (2013.01); *H04B 17/309* (2015.01)

(58) Field of Classification Search
None
See application file for complete search history.

(56) References Cited

U.S. PATENT DOCUMENTS

| | | | |
|---|---|---|---|
| 10,484,021 B1* | 11/2019 | Old | H03M 13/13 |
| 11,165,448 B2* | 11/2021 | Maunder | H03M 13/6362 |
| 11,171,673 B2* | 11/2021 | Tong | H03M 13/09 |
| 2018/0331783 A1* | 11/2018 | Ahn | H04L 27/18 |
| 2020/0106459 A1* | 4/2020 | Gross | H03M 13/39 |
| 2020/0212936 A1* | 7/2020 | Maunder | H03M 13/6508 |
| 2021/0159915 A1 | 5/2021 | Maunder et al. | |

* cited by examiner

*Primary Examiner* — Mujtaba M Chaudry
(74) *Attorney, Agent, or Firm* — ScienBiziP, P.C.

(57) ABSTRACT

A method and an apparatus for decoding polar codes, the method comprising: determining a starting level for processing an overflow according to a number of encoded bits of a received polar encoded codeword, an input bit-width, and an internal bit-width of a decoder; multiplying an output Log-Likelihood Ratio (LLR) value and two input LLR values of the G function by a first coefficient and a second coefficient respectively; and finally, the LLR values corresponding to the received codeword are decoded to obtain decoded bits.

10 Claims, 5 Drawing Sheets

METHOD FOR DECODING POLAR CODES AND APPARATUS THEREOF

FIELD

The subject matter herein generally relates to data coding and decoding.

BACKGROUND

Polar code is a channel coding approach that has become one of the communication standards for 5G in recent years.

The successive cancellation (SC) decoding algorithm is one decoding algorithm for polar codes. It uses the concept of recursion for decoding, which has the advantage of low computational complexity and structured features that can be implemented in hardware. During the SC decoding process, the F function nodes and G function nodes are needed to perform Log-Likelihood Ration (LLR) computation, and the nodes are updated in a sequential manner.

The SC decoding process of polar codes is a level-structured architecture, and each level comprises nodes to compute LLR values. However, the LLR values after each node computation may overflow beyond the finite bit-width of a decoder.

BRIEF DESCRIPTION OF THE DRAWINGS

Implementations of the present technology will now be described, by way of embodiment, with reference to the attached figures, wherein.

DETAILED DESCRIPTION

Figure 1:
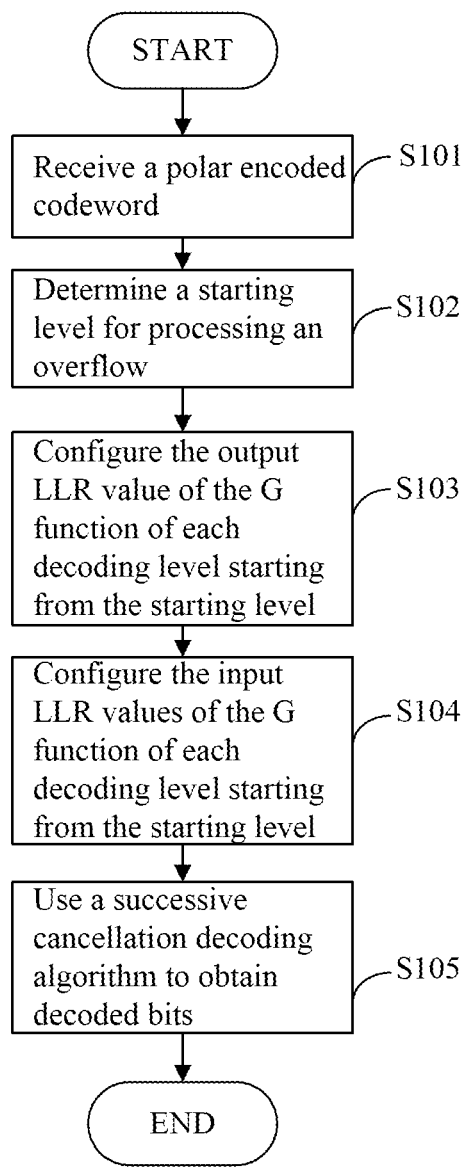
FIG. 1 is a block diagram of one embodiment of a method for decoding polar codes.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

References to "an" or "one" embodiment in this disclosure are not necessarily to the same embodiment, and such references mean "at least one".

In general, the word "module" as used hereinafter, refers to logic embodied in computing or firmware, or to a collection of software instructions, written in a programming language, such as, Java, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives. The term "comprising", when utilized, means "including, but not necessarily limited to"; it specifically indicates open-ended inclusion or membership in a so-described combination, group, series, and the like.

FIG. 1 illustrates a method for decoding polar codes, according to an embodiment. The method is applied in a decoding apparatus.

Step S101, the decoding apparatus receives a polar encoded codeword.

Figure 2:
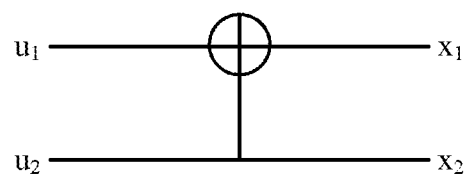
FIG. 2 is a schematic diagram of one embodiment of a polar code encoding.

FIG. 2 illustrates a schematic diagram of the polar code encoding, where $(u_1 \times u_2)$ represents the source bits, and $(x_1 \times x_2)$ represents the encoded bits being output. Specifically, the $x_1 = u_1 \oplus u_2$; and $x_2 = u_2$.

In one embodiment, Log-Likelihood Ration (LLR) values corresponding to the received polar encoded codeword are input to a decoder, wherein the decoder comprises a Successive Cancellation (SC) decoder.

Step S102, the decoding apparatus determines a starting level for processing the overflow according to a number of encoded bits N of the polar encoded codeword, an input bit-width $B_I$ of the decoder, and an internal bit-width $B_D$ of the decoder.

In one embodiment, the decoding apparatus needs $\log_2 N$ decoding levels to decode the N-bit polar encoded codeword, wherein each level comprises at least one F function and at least one G function. During decoding process, the F function and the G function are performed on the corresponding LLR values of the polar encoded codeword, level by level, to obtain decoded bits.

Figure 3:
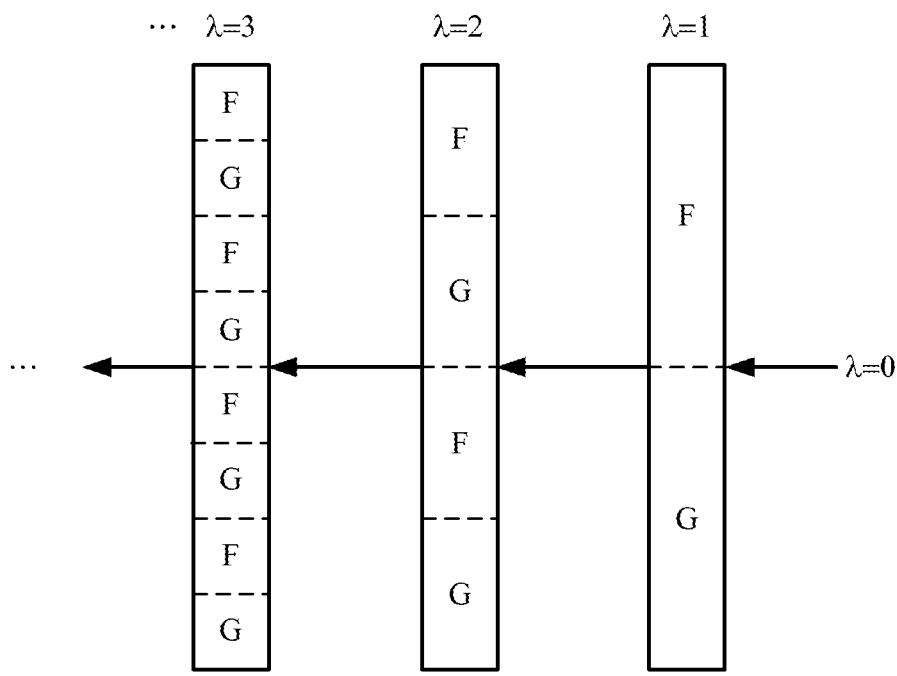
FIG. 3 is a schematic diagram of one embodiment of decoding levels.

FIG. 3 illustrates a schematic diagram of decoding levels in one example, where λ is the current decoding level.

Figure 4:
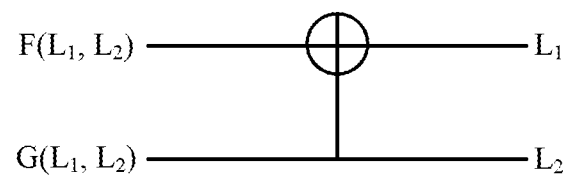
FIG. 4 is a schematic diagram of one embodiment of a polar code decoding.

FIG. 4 illustrates the 2×2 polar code decoding kernel. The SC decoding algorithm is based on successive cancellations over such decoding kernel. There are two LLR input values $L_1$ and $L_2$, and two LLR output values are obtained by the F function ($F(L_1,L_2)$) and the G function ($G(L_1,L_2)$). Specifically, the F function is given by $F(L_1,L_2)=\text{sign}(L_1)\text{sign}(L_2)\min\{|L_1|, |L_2|\}$, and the G function is given by $G(L_1, L_2)=L_1 \pm L_2$. The G function is calculated by using the estimated bit value from the previous decoding to determine whether $G(L_1,L_2)=L_1+L_2$ or $G(L_1,L_2)=L_1-L_2$.

Since the computation of the F function takes the minimum LLR value, the F function operation has no overflow problem. But the G function operation may overflow according to the estimated bit value of the previous decoding. Therefore, the decoding apparatus obtains a start level that is needed to process overflow problem according to a number of encoded bits N of the polar encoded codeword, an input bit-width $B_I$ of the decoder, and an internal bit-width $B_D$ of the decoder. Specifically, the starting level for overflow processing is calculated as $\log_2 N-(B_D-B_I)$.

In one embodiment, the channel quality is detected and determined during decoding, and when poor channel quality is determined, the starting level for overflow process can be dynamically adjusted. For example, the channel quality can be detected and determined by calculating a bit error rate (BER).

Specifically, when poor wireless signal quality is detected, representing channel fading and resulting in the size of the LLR values being different from the input bit-width of the decoder, then the starting level for overflow processing can be postponed. For example, if the overflow processing is originally started at layer 3, it can be deferred to layer 5 when poor wireless signal quality is detected.

For example, the input bit-width $B_I$ of the decoder is 8, and the maximum value of floating points that can be represented is 3.96875. However, when the channel fading is severe and the wireless signal quality is not good, the maximum value received may be less than 1, which is equivalent to only 6 bit-width. In this example, the starting level for overflow processing can be delayed by 2 levels.

Step S103, the decoding apparatus configures the output LLR value of the G function of each decoding level starting from the starting level to multiply by a first coefficient.

Step S104, the decoding apparatus configures the input LLR values of the G function of each decoding level starting from the starting level to multiply by a second coefficient.

In one embodiment, the first coefficient is a positive number.

In one embodiment, the second coefficient is one-half.

In one embodiment, the first coefficient is one-half.

In one embodiment, the first coefficient can be set to different positive values depending on whether the source of the LLR value is an F function or a G function.

Step S105, the decoding apparatus performs F function operation and G function operation on LLR values corresponding to the polar encoded codeword for each decoding level using a successive cancellation decoding algorithm to obtain decoded bits.

Figure 5:
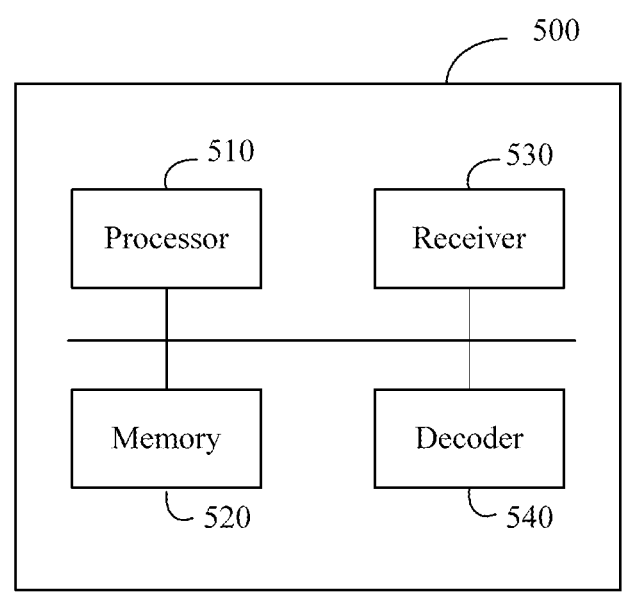
FIG. 5 is a block diagram of one embodiment of an apparatus for decoding polar codes.

FIG. 5 illustrates a decoding apparatus 500 which can decode polar codes according to an embodiment. The decoding apparatus 500 comprises a network device and a terminal device.

The decoding apparatus 500 comprises a processor 510, a memory 520, and a computer program such as a program of a decoding method, stored in the memory 520 and which can be run on the processor 510. The processor 510 performs the steps in the flow of the decoding method when executing the computer program, such as steps S101 to S105 shown in FIG. 1.

The computer program may be divided into one or more modules/units, the one or more modules/units being stored in the memory 520 and executed by the processor 510 to implement the method. The one or more modules/units may be a series of computer program instructions capable of performing a particular function, which instructions are used to describe the execution of the computer program in the decoding apparatus 500.

The decoding apparatus 500 also comprises a receiver 530 and a decoder 540. In one embodiment, the receiver 530 comprises an antenna for receiving wireless signals. The receiver 530 receives the polar encoded codeword and transmits it to the decoder 540 for further processing to obtain the decoded bits. It should be noted that in various embodiments, the above function of the decoder 540 may also be performed by the processor 510.

It should be understood that FIG. 5 is merely an example of the decoding apparatus 500 and does not constitute a limitation of the decoding apparatus 500. Other examples may comprise more or fewer components than shown, or a different combination of certain components, or different components, e.g., the decoding apparatus 500 may also comprise input and output devices, communication device, etc.

In one embodiment, the processor 510 comprises a microcontroller, a microprocessor, a complex instruction set arithmetic microprocessor, a reduced instruction set arithmetic microprocessor, an ultra-long instruction set microprocessor, an ultra-parallel instruction set arithmetic microprocessor, and a digital signal processor or other circuits with computational processing capabilities. The processor 510 is configured to execute or process instructions, data, and computer programs stored in the memory 520.

In one embodiment, the memory 520 comprises a read-only memory (ROM), a random access memory (RAM), a magnetic storage medium device, an optical storage medium device, a flash memory device, an electrical, optical, or other physical/tangible (e.g., non-transitory) computer-readable storage medium device, used to store one or more computer programs that control the operation of the decoding apparatus 500, and are executed by the processor 510.

The decoding method for decoding polar codes and the decoding apparatus of the disclosure can reduce the amount of decoder computation during wireless communication and can dynamically adjust the computational resources required for decoding, according to the wireless signal quality.

The embodiments shown and described above are only examples. Many details are often found in the art such as the other features of the decoding apparatus 500. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for decoding polar codes, the method comprising:
receiving a polar encoded codeword;
determining a starting level for processing an overflow according to a number of encoded bits N of the polar encoded codeword, an input bit-width $B_I$ of a decoder, and an internal bit-width $B_D$ of the decoder;
configuring an output log-likelihood ratio (LLR) value of a G function for each decoding level starting from the starting level to multiply by a first coefficient;
configuring input LLR values of the G function for each decoding level starting from the starting level to multiply by a second coefficient; and
performing F function operation and G function operation on LLR values corresponding to the polar encoded codeword for each decoding level using a successive cancellation decoding algorithm to obtain decoded bits.

2. The method of claim 1, wherein the starting level is determined as $\log_2 N - (B_D - B_I)$.

3. The method of claim 1, wherein the first coefficient is a positive number.

4. The method of claim 1, wherein the second coefficient is one-half.

5. The method of claim 1, wherein the method further comprises:
detecting a channel quality;
determining whether the channel is good or poor; and
adjusting the starting level when the channel quality is determined as poor.

6. An apparatus for decoding polar codes, the apparatus comprising:

a decoder;

a processor; and a memory for storing at least one computer program, wherein the at least one computer program comprises instructions which are executed by the processor, and performs a method comprising:

receiving a polar encoded codeword;

determining a starting level for processing an overflow according to a number of encoded bits N of the polar encoded codeword, an input bit-width $B_I$, of the decoder, and an internal bit-width $B_D$ of the decoder;

configuring an output log-likelihood ratio (LLR) value of a G function for each decoding level starting from the starting level to multiply by a first coefficient;

configuring input LLR values of the G function for each decoding level starting from the starting level to multiply by a second coefficient; and performing F function operation and G function operation on LLR values corresponding to the polar encoded codeword for each decoding level using a successive cancellation decoding algorithm to obtain decoded bits.

7. The apparatus of claim 6, wherein the starting level is determined as $\log_2 N-(B_D-B_I)$.

8. The apparatus of claim 6, wherein the first coefficient is a positive number.

9. The apparatus of claim 1, wherein the second coefficient is one-half.

10. The apparatus of claim 1, wherein the method further comprises:

detecting a channel quality;

determining whether the channel is good or poor; and adjusting the starting level when the channel quality is determined as poor.

* * * * *